(12) United States Patent
Noh et al.

(10) Patent No.: US 9,997,694 B2
(45) Date of Patent: Jun. 12, 2018

(54) THERMOELECTRIC GENERATING SYSTEM

(71) Applicant: HYUNDAI MOTOR COMPANY, Seoul (KR)

(72) Inventors: Su Jung Noh, Seoul (KR); Jin Woo Kwak, Gyeongsangbuk-do (KR); In Woong Lyo, Gyeonggi-do (KR); Han Saem Lee, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 210 days.

(21) Appl. No.: 15/058,849

(22) Filed: Mar. 2, 2016

(65) Prior Publication Data
US 2017/0098751 A1  Apr. 6, 2017

(30) Foreign Application Priority Data

Oct. 6, 2015  (KR) .......................... 10-2015-0140597

(51) Int. Cl.
*H01L 35/32* (2006.01)
*H01L 35/02* (2006.01)
*B60R 16/03* (2006.01)

(52) U.S. Cl.
CPC .............. *H01L 35/32* (2013.01); *H01L 35/02* (2013.01); *B60R 16/03* (2013.01)

(58) Field of Classification Search
CPC ......... H01L 35/02; H01L 35/04; H01L 35/28; H01L 35/30; H01L 35/32; H01L 35/34
See application file for complete search history.

(56) References Cited

U.S. PATENT DOCUMENTS

| 6,002,081 A | 12/1999 | Sakuragi |
| 2005/0056310 A1 | 3/2005 | Shikata et al. |
| 2005/0172993 A1 | 8/2005 | Shimoji et al. |
| 2011/0197941 A1* | 8/2011 | Dannoux ................ F01N 5/025 136/201 |
| 2012/0186272 A1 | 7/2012 | Son |
| 2014/0026933 A1* | 1/2014 | Kell ........................ H01L 35/32 136/205 |
| 2016/0181500 A1* | 6/2016 | Lin .......................... H01L 35/32 136/205 |

FOREIGN PATENT DOCUMENTS

| JP | 2004-350479 A | 12/2004 |
| JP | 2005-223131 A | 8/2005 |
| KR | 10-2010-0120339 A | 11/2010 |
| KR | 10-2011-0077486 | 7/2011 |
| KR | 10-1327730 | 11/2013 |

* cited by examiner

*Primary Examiner* — Devina Pillay
*Assistant Examiner* — Daniel P Malley, Jr.
(74) *Attorney, Agent, or Firm* — Brinks Gilson & Lione

(57) ABSTRACT

Provided is a thermoelectric generating system which may be easily installed in a heat source of a vehicle and which is easy to assemble and disassemble overall by eliminating the necessity to be assembled with a cooling module. The thermoelectric generating system includes a first substrate, a second substrate configured to be slidably engageable in contiguity with a heat source of a vehicle, and a thermoelectric module disposed between the first substrate and the second substrate.

8 Claims, 4 Drawing Sheets

THERMOELECTRIC GENERATING SYSTEM

CROSS-REFERENCE TO RELATED APPLICATION

The present application claims the benefit of priority to Korean Patent Application No. 10-2015-0140597, filed on Oct. 6, 2015, in the Korean Intellectual Property Office, the disclosure of which is incorporated herein in its entirety by reference.

TECHNICAL FIELD

The present disclosure relates to a thermoelectric generating system, and more particularly, to a thermoelectric generating system which may be easily detachably attached and has increased durability.

BACKGROUND

As known, a thermoelectric generating system is configured to generate electricity by a thermoelectric module, and here, the thermoelectric module may generate electricity using a Seebeck effect that thermoelectromotive force is generated due to a temperature difference between both surfaces thereof.

In a case in which such a thermoelectric generating system is applied to a vehicle, one surface of a thermoelectric module may be installed in a heat source such as an exhaust system or an engine to form a hot side on the one surface of the thermoelectric module and a cooling module may be installed on the other surface of the thermoelectric module to form a cold side thereon. Thus, the hot side and the cold side may be formed to face each other on both surfaces of the thermoelectric module, and electricity may be generated due to a temperature difference between the hot side and the cold side.

However, in the related art thermoelectric generating system, since the thermoelectric module, the heat source, the cooling module are assembled through a fastener (a bolt or a nut), the fastener may be loosened due to vibrations of a vehicle, impeding smooth thermoelectric generation.

In addition, when an N-type semiconductor device and a P-type semiconductor device forming the thermoelectric module are to be replaced, the thermoelectric generating system is required to be disassembled overall, causing the replacement operation to be cumbersome and to take a long time.

SUMMARY

The present disclosure has been made to address the above-mentioned problems occurring in the prior art while advantages achieved by the prior art are maintained intact.

An aspect of the present disclosure provides a thermoelectric generating system which may be easily installed in a heat source of a vehicle and which is easy to assemble and disassemble overall by eliminating the necessity to be assembled with a cooling module.

According to an exemplary form of the present disclosure, a thermoelectric generating system includes: a first substrate; a second substrate configured to be slidably engageable in contiguity with a heat source of a vehicle; and a thermoelectric module disposed between the first substrate and the second substrate.

A heat transmission block may be installed in the heat source of the vehicle, and the second substrate may have a coupler slidably engaged with the heat transmission block.

One or more rails and one or more flanges may be provided to correspond to each other in a portion in which the coupler and the heat transmission block are coupled to each other.

A cooling module may be integrally provided in the first substrate.

The cooling module may include a cooling flow channel provided within the first substrate.

The cooling module may have a connector communicating with the cooling flow channel, and the connector may protrude outwardly from the cooling module.

A coupler having one or more rails may be provided in the first substrate.

The thermoelectric module may include a plurality of semiconductor devices and an electrode having a plurality of upper electrodes connected to upper surfaces of the plurality of semiconductor devices and a plurality of lower electrodes connected to lower surfaces of the plurality of semiconductor devices.

A pair of power terminals may be connected to the electrode of the thermoelectric module.

The power terminal may be configured as an electrical connector in the form of a plug.

According to another exemplary form of the present disclosure, a thermoelectric generating system includes: a thermoelectric module; a first substrate attached to one side of the thermoelectric module and having a cooling flow channel integrally formed therein; a second substrate attached to the other side of the thermoelectric module and detachably installed in a heat source of a vehicle; and a pair of power terminals integrally connected to the thermoelectric module, wherein the second substrate has a coupler slidably engaged with the heat source of the vehicle.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
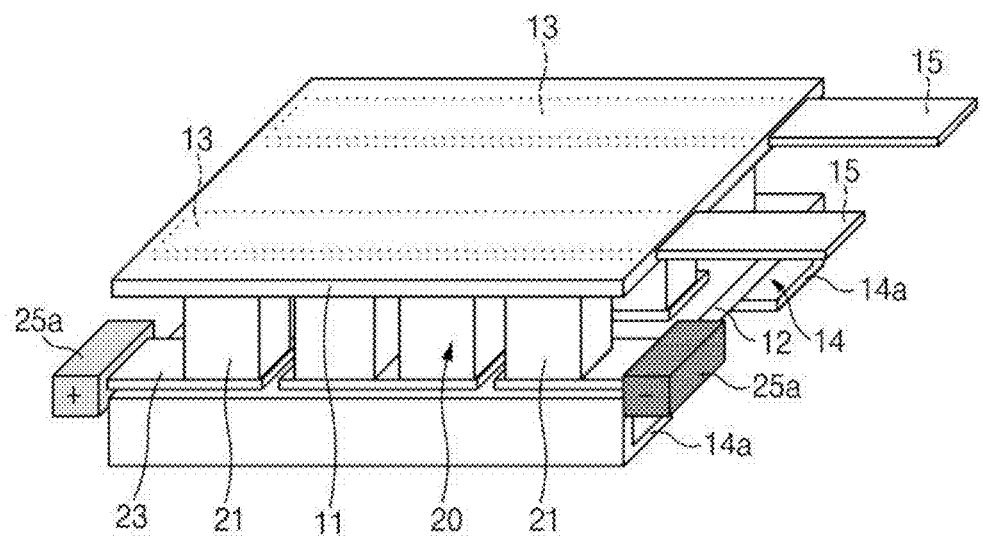
FIG. 1 is a perspective view illustrating a thermoelectric generating system according to various exemplary forms of the present disclosure.

Hereinafter, exemplary forms of the present disclosure will be described in detail with reference to the accompanying drawings. For reference, dimensions of elements or thicknesses of lines illustrated in the drawings referred to describe the present disclosure may be exaggerated for the convenience of understanding. Also, the terms used henceforth have been defined in consideration of the functions of the present disclosure, and may be altered according to the intent of a user or operator, or conventional practice. Therefore, the terms should be defined on the basis of the entire content of this specification.

Figure 2:
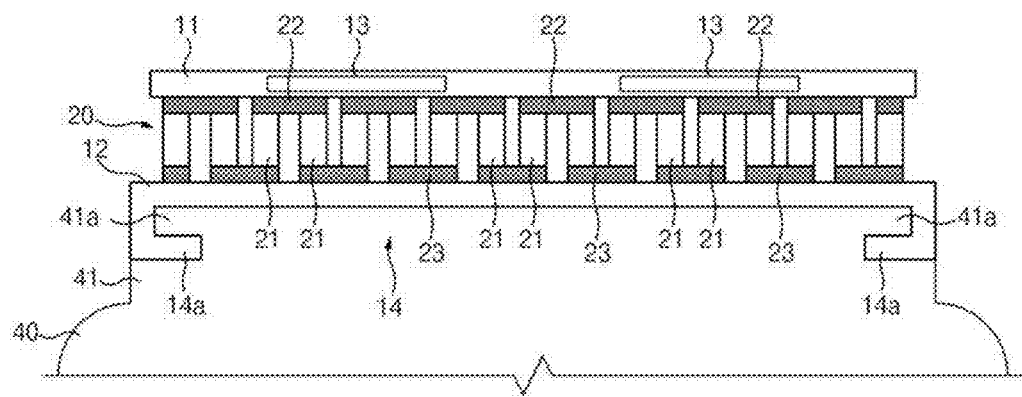
FIG. 2 is a front view of the thermoelectric generating system of FIG. 1.

Referring to FIGS. 1 and 2, a thermoelectric generating system in various exemplary forms of the present disclosure may include a first substrate 11, a second substrate 12 adjacent to a heat source of a vehicle and slidably engaged therewith, and a thermoelectric module 20 disposed between the first substrate 11 and the second substrate 12.

The first substrate 11 may be formed of a flat plate and disposed on one side of the thermoelectric module 20.

A cooling module may be integrally formed within the first substrate 11, and due to the cooling module, the first substrate 11 and one side of the thermoelectric module 20 adjacent thereto may form a cold side.

The cooling module may include a cooling flow channel integrally formed within the first substrate 11. As a coolant passes through the cooling flow channel 13, the first substrate 11 and one side of the thermoelectric module 20 adjacent thereto may effectively form the cold side.

The cooling flow channel 13 may have various structures such as a uni-directional channel in which a coolant flows only in one direction, a bi-directional channel in which a coolant flows in mutually facing directions, and other multi-channels.

The second substrate 12 is installed on a heat source 40 of the vehicle such as a heat protector or an exhaust pipe, and thus, the second substrate 12 and the other side of the thermoelectric module 20 adjacent thereto may form a hot side.

In various exemplary forms, as illustrated in FIG. 2, a heat transmission block 41 is installed to be adjacent to the heat source 40 of a vehicle and receiving heat therefrom. The heat transmission block 41 may be formed of a thermally conductive material and integrally formed with the heat source 40 or may be coupled thereto through welding, or the like.

The second substrate 12 may have a coupler 14 slidably engageable to the heat transmission block 41.

The coupler 14 and the heat transmission block 41 may have one or more rails and one or more flanges at portions thereof which are mutually coupled to each other. The one or more rails and the one or more flanges may correspond to each other.

As illustrated in FIG. 2, the coupler 14 may have one or more rails 14a, and the heat transmission block 41 may have one or more flanges 41a. Thus, as the rail 14a of the coupler 14 is slidably engaged with the flange 41a of the heat transmission block 41, the second substrate 12 may be firmly and simply assembled to the heat source of the vehicle and may also be easily disassembled therefrom.

The thermoelectric module 20 may be disposed between the first substrate 11 and the second substrate 12, and thus, the thermoelectric module 20 may effectively perform thermoelectric generation due to a temperature difference between the second substrate 12 as the hot side and the first substrate 11 as the cold side.

The thermoelectric module 20 may have a plurality of semiconductor devices 21, a plurality of upper electrodes 22 connected to upper surfaces of the semiconductor devices 21, and a plurality of lower electrodes 23 connected to lower surfaces of the semiconductor devices 21.

The plurality of semiconductor devices 21 may include a plurality of N-type semiconductor devices and a plurality of P-type semiconductor devices.

The first substrate 11 may be attached to the plurality of upper electrodes 22, and the second substrate 12 may be attached to the plurality of lower electrodes 23.

Power terminals 25a and 25b may be connected to at least one of the upper electrode 22 and the lower electrode 23 through welding, or the like.

According to various exemplary forms, the power terminals 25a and 25b may be formed of an electrical connector such as a Bayonet Neill-Concelman (BNC) connector, a SubMiniature version A (SMA) connector, a plug, or a socket, and thus, an external power line may be simply connected thereto.

Figure 3:
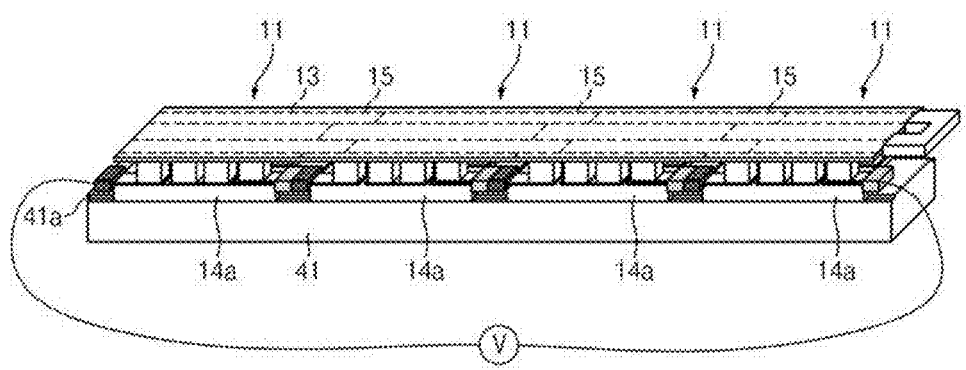
FIG. 3 is a perspective view illustrating a thermoelectric generating system according to another exemplary form of the present disclosure.

FIG. 3 is a view illustrating a thermoelectric generating system according to another exemplary form of the present disclosure, in which a plurality of thermoelectric modules 20 are connected in series or parallel.

In order to effectively implement the structure in which the plurality of thermoelectric modules 20 are connected, a plurality of first substrates 11 may be configured such that cooling flow channels 13 thereof communicate with each other.

To this end, a connector 15 communicating with the cooling flow channels 13 may be formed in the first substrates 11 such that they protrude outwardly. The connector 15 may be smaller than the cooling flow channel 13. As the connector 15 of the first substrate 11 at one side is inserted into the cooling flow channel 13 of the first substrate 11 at the other side, the cooling flow channels 13 may communicate with each other through the connector 15 air-tightly, as illustrated in FIG. 3.

As the heat transmission block 41 extends in a length direction, the rails 14a of the couplers 14 of the plurality of second substrates 12 may be continuously slidably engaged with the flange 41a side of the heat transmission block 41.

That is, in another exemplary form of the present disclosure, in a case in which a plurality of thermoelectric modules 20 are intended to be connected to each other, the cooling flow channels 13 of the first substrates 11 may communicate with each other through the connector 15 air-tightly and the couplers 14 of the second substrate 12 may be continuously slidably engaged with the heat transmission block 41, whereby the plurality of thermoelectric modules 20 may be effectively connected, and accordingly, thermoelectric generation efficiency may be considerably improved.

Figure 4:
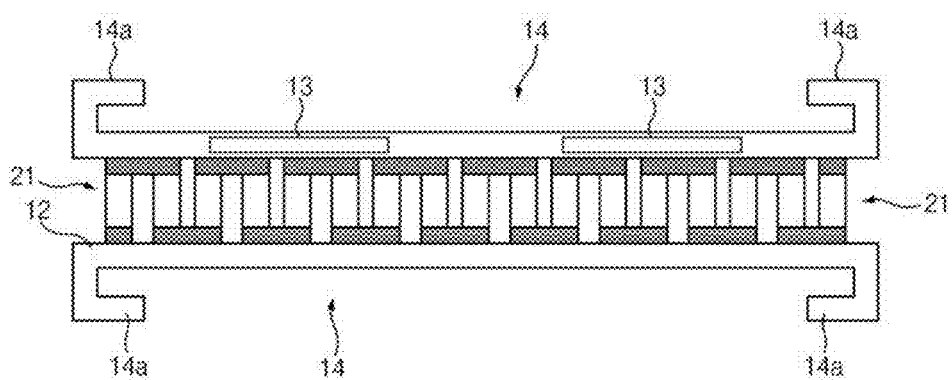
FIG. 4 is a front view of a thermoelectric generating system according to another exemplary form of the present disclosure.

FIG. 4 is a front view of a thermoelectric generating system according to another exemplary form of the present disclosure, in which couplers 14 are formed on each of the first substrate 11 and the second substrate 12, having a vertically symmetrical structure.

Thus, since the second substrate 12 is slidably engageable with the heat transmission block 41 and the first substrate 11 is slidably engageable with another component, assembling characteristics of the thermoelectric generating system according to forms of the present disclosure may be significantly enhanced.

As described above, according to some forms of the present disclosure, the thermoelectric generating system may be easily installed in a heat source of a vehicle and it is not required to be fastened to a cooling module, facilitating overall assembling and disassembling.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:
1. A thermoelectric generating system comprising:
a plurality of first substrates connected in series;

a plurality of second substrates configured to be slidably engageable in contiguity with a heat source of a vehicle, wherein the plurality of second substrates are connected in series;

a plurality of thermoelectric modules disposed between the first substrate and the second substrate, wherein the plurality of thermoelectric modules are connected in series;

a plurality of cooling modules, each including a cooling flow channel provided within each of the plurality of first substrates; and a plurality of connectors configured to connect at least two of the plurality of first substrates;

wherein a first connector from the plurality of connectors is configured to connect at least a first first substrate and a second first substrate from the plurality of first substrates via communicating between a cooling flow channel of the first first substrate and a cooling flow channel of the second first substrate;

wherein the first connector is inserted into an inserting side of the cooling flow channel of the first first substrate and inserted into a receiving side of the cooling flow channel of the second first substrate for direct communication between the first first substrate and the second first substrate through the first connector; and wherein the first connector is smaller than the cooling flow channel of the first first substrate and the cooling flow channel of the second first substrate.

2. The thermoelectric generating system according to claim 1, further comprising a heat transmission block installed in the heat source of the vehicle, wherein the plurality of second substrates have a coupler slidably engaged with the heat transmission block.

3. The thermoelectric generating system according to claim 2, wherein one or more rails and one or more flanges are provided to correspond to each other in a portion in which the coupler and the heat transmission block are coupled to each other.

4. The thermoelectric generating system according to claim 1, wherein a coupler having one or more rails is provided in the plurality of first substrates.

5. The thermoelectric generating system according to claim 4, wherein the plurality of thermoelectric modules include a plurality of semiconductor devices and an electrode having a plurality of upper electrodes connected to upper surfaces of the plurality of semiconductor devices and a plurality of lower electrodes connected to lower surfaces of the plurality of semiconductor devices.

6. The thermoelectric generating system according to claim 5, wherein a pair of power terminals are connected to the electrode of the thermoelectric module.

7. The thermoelectric generating system according to claim 6, wherein the power terminals are configured as an electrical connector.

8. A thermoelectric generating system comprising:

a plurality of thermoelectric modules connected in series;

a plurality of first substrates attached to one side of each of the plurality of thermoelectric modules, each of the plurality of first substrates having a cooling flow channel integrally formed therein and a connector communicating via the cooling flow channel;

a plurality of second substrates attached to the other side of each of the plurality of thermoelectric modules and detachably installed in a heat source of a vehicle; and a pair of power terminals integrally connected to the thermoelectric module, wherein the second substrate has a coupler slidably engaged with the heat source of the vehicle;

wherein the connector protrudes outwardly from each of the plurality of the first substrates;

wherein the connector is smaller than the cooling flow channel; and wherein the connector of a first first substrate at an inserting side is inserted into the cooling flow channel of a second first substrate at a receiving side, thereby the cooling flow channel of the first first substrate and the cooling flow channel of the second first substrate directly communicate with each other through the connector.

* * * * *